US006291374B1

(12) United States Patent
Landi

(10) Patent No.: US 6,291,374 B1
(45) Date of Patent: Sep. 18, 2001

(54) POLYBUTADIENE AND POLYISOPRENE BASED THERMOSETTING COMPOSITIONS AND METHOD OF MANUFACTURE

(75) Inventor: Vincent R. Landi, Danielson, CT (US)

(73) Assignee: World Properties, Inc., Lincolnwood, IL (US)

( * ) Notice: Subject to any disclaimer, the term of this patent is extended or adjusted under 35 U.S.C. 154(b) by 0 days.

(21) Appl. No.: 09/531,947

(22) Filed: Mar. 21, 2000

Related U.S. Application Data

(63) Continuation-in-part of application No. 09/132,869, filed on Aug. 12, 1998, now Pat. No. 6,048,807, which is a continuation-in-part of application No. 09/176,788, filed on Oct. 22, 1998, now Pat. No. 6,071,836, which is a continuation-in-part of application No. 08/690,929, filed on Aug. 1, 1996, now Pat. No. 5,858,887, which is a continuation-in-part of application No. 08/322,890, filed on Oct. 13, 1994, now Pat. No. 5,571,609.

(51) Int. Cl.[7] ..................................... D03D 3/00
(52) U.S. Cl. .................. 442/237; 442/173; 442/180; 442/232; 442/233; 442/234; 524/571
(58) Field of Search ..................... 442/173, 180, 442/232, 233, 234, 237; 524/571

(56) References Cited

U.S. PATENT DOCUMENTS

| | | |
|---|---|---|
| 3,642,687 | 2/1972 | Naarmann et al. . |
| 3,644,584 | 2/1972 | Fryd . |
| 3,860,672 | 1/1975 | Lagally . |
| 3,919,133 | 11/1975 | Dawans et al. . |
| 3,940,534 | 2/1976 | Fick et al. . |
| 4,017,436 | 4/1977 | Tabana et al. . |
| 4,113,800 | 9/1978 | Lee, Jr. . |
| 4,197,377 | 4/1980 | Bohm et al. . |
| 4,229,550 | 10/1980 | Jones et al. . |
| 4,241,132 | 12/1980 | Pratt et al. . |
| 4,267,080 | 5/1981 | Yokoyama et al. . |
| 4,268,433 | 5/1981 | Sawatari et al. . |
| 4,370,448 | 1/1983 | Leland . |
| 4,384,066 | 5/1983 | O'Shea . |
| 4,499,240 | 2/1985 | Valentine . |
| 4,554,470 | 11/1985 | Jerson et al. . |
| 4,578,420 | 3/1986 | Handl . |
| 4,587,300 | 5/1986 | Valentine . |
| 4,600,745 | 7/1986 | Creighton . |
| 4,704,318 | 11/1987 | Saito et al. . |
| 4,780,507 | 10/1988 | Gaku et al. . |
| 4,789,708 | 12/1988 | Guzy . |
| 4,820,764 | 4/1989 | Guzy et al. . |
| 4,886,699 | 12/1989 | Carroll et al. . |
| 4,904,760 | 2/1990 | Gaku et al. . |
| 4,997,702 | 3/1991 | Gazit et al. . |
| 5,223,568 | 6/1993 | Landi et al. . |
| 5,264,065 | 11/1993 | Kohm . |
| 5,354,611 | 10/1994 | Arthur et al. . |
| 5,358,775 | 10/1994 | Horn, III . |
| 5,374,453 | 12/1994 | Swei et al. . |
| 5,506,049 | 4/1996 | Swei et al. . |
| 5,552,210 | 9/1996 | Horn, III et al. . |
| 5,571,609 | 11/1996 | St. Lawrence et al. . |
| 5,858,887 | 1/1999 | St. Lawrence et al. . |

FOREIGN PATENT DOCUMENTS

| | | |
|---|---|---|
| 2648595 | 5/1977 | (CH) . |
| 2539412 | 9/1975 | (DE) . |
| 2648595 | 5/1977 | (DE) . |
| 0202488 | 11/1986 | (EP) . |
| 0220160 | 4/1987 | (EP) . |
| 0234450 | 9/1987 | (EP) . |
| 0389076 | 9/1990 | (EP) . |
| 0430092A3 | 6/1991 | (EP) . |
| 0460539A2 | 12/1991 | (EP) . |
| 0707038A1 | 9/1995 | (EP) . |
| 1195567 | 6/1970 | (GB) . |
| 2061989A | 5/1981 | (GB) . |
| 2172892 | 10/1986 | (GB) . |
| 5375250 | 4/1978 | (JP) . |
| 6178871 | 4/1986 | (JP) . |
| 4258658 | 9/1992 | (JP) . |
| 050162238 | 6/1993 | (JP) . |
| 050309651 | 11/1993 | (JP) . |

OTHER PUBLICATIONS

"High Vinyl 1–2 Liquid Polybutadiene–Ricon Molding Compounds CCS–110" Feb. 1, 1980 Colorado Chemical Spec.

Colorado Chemical Brochure—"Ricon Product Bulletin", Aug. 20, 1985 Hign Vinyl 1–2 Liquid Polybutadiene.

Bruzzone et al., LaChimica E. L'Industria 47(12)1298–1302 (1965) "High–Temperature Thermal Cross–linking of Cistatic Polybutadiene".

McCreedy et al., Polymer 20(4)(1979) "Effect of Thermal Crosslinking on Decomposition of Polybutadiene".

Barth et al., Modern Plastics pp. 142–148, *(Nov. 1970) "Fast–Curing Polybutadiene Thermosetting Resins".

United Kingdom Search Report dated Sep. 17, 1997.

N. Sawatari, I. Watanabe, H. Okuyama and K. Murakawa, "A New Flame Retardant, 1,2–Polybutadiene Laminate", 1983 pp. 131–137.

Drake, Ronald E., "1,2–Polybutadienes–High Performance Resins for the Electrical Industry", ANTEC, 1984, pp. 730–733.

(List continued on next page.)

Primary Examiner—Helen L. Pezzuto
(74) Attorney, Agent, or Firm—Cantor Colburn LLP

(57) ABSTRACT

An electrical substrate material is presented comprising a resin matrix which includes a thermosetting polybutadiene or polyisoprene resin, an ethylene propylene rubber, and optionally a thermoplastic unsaturated butadiene- or isoprene-containing polymer; a particulate filler, a flame retardant additive, a curing agent, and a woven or unwoven fabric. The presence of the ethylene propylene rubber enhances the heat age properties of the substrate material, particularly the dielectric strength and the mechanical properties, while other electrical, chemical, and mechanical properties of the material are not adversely effected.

35 Claims, 2 Drawing Sheets

OTHER PUBLICATIONS

Takeuchi, Yasumasa, et al, "A New Thermoplastic Syndiotactic 1,2–Polybutadiene. I. Productions, Fundamental Properties, and Processing", ACS, Apr. 1–2, 1974, pp. 15–25.

Chen, C.F., "Dielectric Properties of Polybutadiene and Its Reinforced Composites At Room and Elevated Temperature", IEEE 10th Electrical Insulation Conference Proceedings, Chicago, Sep. 20 & 21, 1971, pp. 318–320.

US 6,291,374 B1

POLYBUTADIENE AND POLYISOPRENE BASED THERMOSETTING COMPOSITIONS AND METHOD OF MANUFACTURE

CROSS REFERENCE TO RELATED APPLICATION

This is a continuation-in-part of U.S. application Ser. No. 09/132,869 filed Aug. 12, 1998, now U.S. Pat. No. 6,048, 807, and a continuation-in-part of U.S. application Ser. No. 09/176,788, filed Oct. 22, 1998, now U.S. Pat. No. 6,071, 836, which is a continuation-in-part of U.S. application Ser. No. 08/690,929, filed Aug. 1, 1996 now U.S. Pat. No. 5,858,887, which is a continuation in part of application Ser. No. 08/322,890, filed Oct. 13, 1994 now U.S. Pat. No. 5,571,609, all of which are incorporated herein by reference.

BACKGROUND OF THE INVENTION

1. Field of the Invention

This invention relates generally to the field of circuit boards. In particular, this invention relates to substrates for circuit boards comprising a thermosetting composition, wherein the thermosetting composition comprises a polybutadiene/polyisoprene resin and a low molecular weight ethylene propylene rubber.

2. Brief Description of the Related Art

Circuit boards generally comprise an electrical substrate material laminated to a conductive metal layer, usually copper. Electrical substrate materials used in circuit boards are most commonly composites, comprising a polymeric matrix and an inorganic particulate and/or fibrous filler. Polybutadiene and polyisoprene resins and combinations thereof are particularly useful thermosetting compositions as described in commonly assigned U.S. Pat. No. 5,233,568 to Landi et al. and U.S. Pat. No. 5,571,609 to St. Lawrence et al., both of which are herein incorporated by reference in their entirety. U.S. Pat. No. 5,233,568 discloses a moldable thermosetting composition which is first formed into a shape, and then cured at a high temperature of greater than about 250° C. U.S. Pat. No. 5,571,609 discloses a thermosetting resin comprising a polybutadiene or polyisoprene resin and an unsaturated butadiene- or isoprene-containing polymer in an amount of 25 to 50 volume percent (vol %); a woven glass fabric in an amount of 10 to 40 vol %; and a particulate filler in an amount of 5 to 60 vol %. This filled composite material leads to a prepreg which has very little tackiness and can therefore be easily handled by operators. The material in accordance with this patent has a low dissipation factor, a consistent, low dielectric constant, and a low coefficient of thermal expansion, and is therefor ideal for wireless communication and high speed, high frequency signal transmission applications.

Other polymeric matrices and substrates commonly used for circuit boards are disclosed in U.S. Pat. No. 5,264,065 to Kohm, which describes a base material for printed wiring boards where inert filler is used to control Z axis coefficient of thermal expansion in fiberglass reinforced thermoset resins. The Kohm patent discloses a range of 45–65 weight percent (wt %) fiberglass reinforcement and a range of 30 to 100 parts filler per 100 parts of the polymer. U.S. Pat. No. 4,997,702 to Grant et al. discloses a circuit laminate having an epoxy resin system which also includes inorganic fillers or fibers in the range of 20–70 wt % of the total composite. The fibers include both glass and polymeric fibers and the fillers include clay or mineral (e.g., silica) particulate fillers. U.S. Pat. No. 4,241,132 to Pratt et al. discloses an insulating board comprising a polymeric matrix such as polybutadiene and a filler consisting of polymeric filler (e.g., fibrous polypropylene). In all cases, the dielectric constant or dissipation factor of the resin matrix is matched to the fibrous reinforcement in order to obtain an isotropic composite.

European Patent No. 202 488 A2 discloses a polybutadiene based laminate wherein a high molecular weight, bromine-containing prepolymer is used to reduce tack and flammability of a 1,2-polybutadiene resin. Similarly, in Japanese Patent No. 04,258,658, a high molecular weight compound is added to a tacky polybutadiene resin to control tack. The compound utilized is a halogen-containing bismaleimide which provides flammability resistance as well as good copper bonding and heat resistance. There is no mention of the use of fillers and the resulting laminate has a relatively high dissipation factor. An article titled "A New Flame Retardant 1,2-Polybutadiene Laminate by N. Sawatri et al., IEEE Transactions on Electrical Insulation, Vol. EI-18, No. 2, April 1983 uses a high percentage of very high molecular polybutadiene and a low molecular weight, modified polybutadiene as a minor component, but there is no mention of the use of filler of any type.

The article entitled "1,2 Polybutadiene-High Performance Resins for the Electrical Industry", by R. E. Drake, ANTEC '84 pp. 730–733 (1984), generally discloses conventional polybutadiene resins for use in laminates and specifically discloses the use of reactive monomers which react with the polybutadiene. U.K. Patent Application 2 172 892A, generally discloses laminates composed of styrene-containing and thermoplastic copolymers with unsaturated double bonds and polybutadiene.

Application Ser. No. 09/132,869, filed Aug. 12, 1998, discloses polybutadiene or polyisoprene-based circuit board substrates comprising liquid ethylene propylene rubbers.

Such materials undergo a thermal cure at a high temperature (e.g., greater than about 250° C.), without loss of copper bonding strength. Use of the ethylene propylene rubber and a styrene-butadiene block copolymer allows the materials to achieve the required high dielectric strength. However, such materials generally do not contain flame retardants due to the high temperature cure conditions.

While the above composites are well-suited for their intended purposes, the industry is constantly moving to the processing and use of circuit boards under ever more stringent environmental conditions. Properties such as dielectric strength should accordingly be well retained at the elevated temperatures which may be encountered during processing or use. Underwriters Laboratories, Inc. (UL) has developed protocols for characterizing the temperature limits that circuit boards and circuit board substrate materials can withstand during processing applications and under prolonged use. The UL Relative Thermal Index (RTI) identifies the temperature at which a material endures 100,000 hours of use before losing half of its initial dielectric break down strength or mechanical (tensile or flexural) strength. The RTI is generally thickness dependent, and so UL grants RTI's to circuit board materials at different thicknesses. Industry is furthermore requiring that circuit boards meet the UL Flammability test. Consequently, there is a perceived need in the art for circuit board substrates which have improved flammability resistance; improved time to the loss of initial dielectric and mechanical strength at a given temperature and at a given thickness; and improved retention of dielectric constant and mechanical strength at elevated temperatures, all while maintaining optimal electrical, chemical and processing characteristics as well as low cost.

SUMMARY OF THE INVENTION

The above-discussed and other drawbacks and deficiencies of the prior art are overcome or alleviated by low temperature cure, flame retardant, electrical substrate material comprising, based on the total composition, about 10 vol % to about 75 vol % of a resin composition which comprises a thermosetting polybutadiene or polyisoprene resin, a low molecular weight ethylene propylene rubber in an amount of up to about 20 wt % (based on the total resin composition), and optionally a thermoplastic unsaturated butadiene- or isoprene-containing polymer capable of participating in cross-linking with the polybutadiene or polyisoprene resin; about 20 to about 60 parts per hundred parts of the resin composition of a flame retardant; up to about 50 vol % fabric; up to about 65 vol % particulate filler; and an effective quantity of a peroxide curing agent. The composition possesses improved fire retardance over prior art electrical circuit materials, as well as improved stability in dielectric constant and mechanical properties with thermal aging. In a preferred embodiment, at least a portion of the substrate is laminated to a conductive metal such as copper.

These and other features, aspects, and advantages of the present invention will become better understood with reference to the following detailed description, drawings, and appended claims.

BRIEF DESCRIPTION OF THE DRAWINGS

Referring now to the drawings wherein like elements are numbered alike in the several FIGURES.

DESCRIPTION OF THE PREFERRED EMBODIMENTS

Figure 1:
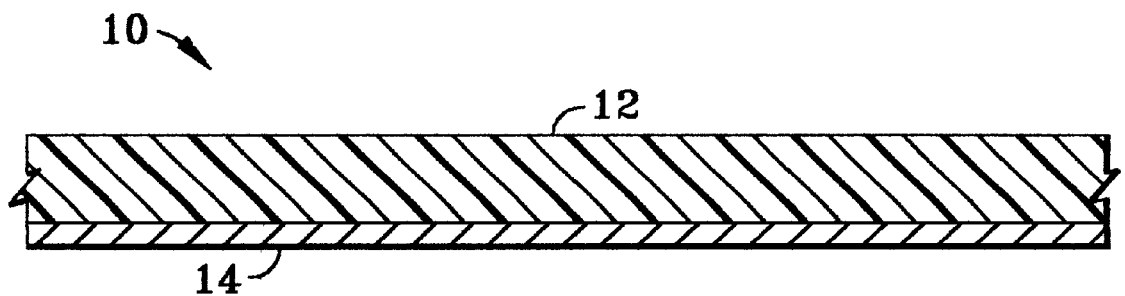
FIG. 1 is a cross-sectional elevation view of a circuit substrate material in accordance with the present invention.

The present invention preferably comprises a resin composition, a woven or nonwoven fabric, at least one type of particulate filler, a flame retardant, and a peroxide-based curing agent. The resin composition comprises a thermosetting polybutadiene or polyisoprene resin, an ethylene propylene rubber and optionally a thermoplastic unsaturated butadiene- or isoprene-containing polymer. The resin system, fabric, fillers, flame retardants, curative agents, and representative constructions together with Examples are discussed in detail below. In general, the thermosetting compositions are processed as described in U.S. Pat. No. 5,571,609 to St. Lawrence et al.

Resin System

The resin system used in the electrical substrate material of this invention is a resin composition generally comprising: (1) a thermosetting polybutadiene or polyisoprene resin or mixture thereof; (2) an ethylene propylene rubber (ethylene propylene copolymer (EPM) or ethylene propylene diene terpolymer (EPDM)); and optionally (3) a thermoplastic unsaturated butadiene- or isoprene-containing polymer capable of participating in crosslinking with the polybutadiene or polyisoprene resin during cure.

The polybutadiene or polyisoprene resin crosslinks during cure and may be liquid or solid at room temperature, with liquid preferred in order to maintain the viscosity of the composition at a manageable level during processing. Liquid resins may have a number average molecular weight greater than about 5,000 but preferably have a molecular weight of less than about 5,000 (most preferably between about 1,000 and about 3,000). Polybutadiene and polyisoprene resins having at least 90 wt % 1,2-addition are preferred because they exhibit the greatest crosslink density upon cure due to the large number of pendent vinyl groups available for crosslinking. High crosslink densities are desirable because such electrical circuit substrates exhibit superior high temperature properties. Possible resins include B3000 resin, a low molecular weight polybutadiene liquid resin having greater than 90 wt % 1,2-addition and B1000 a lower molecular weight polybutadiene liquid resin having greater than 90 wt % 1,2-addition, commercially available from Nippon Soda, Ltd., Japan; and RICON liquid 1,2-polybutadienes from Ricon, Grand Junction, Colo. among others.

In order to improve the stability of the dielectric strength and mechanical properties of the resulting electrical substrate material over time, a lower molecular weight ethylene propylene rubber is added to the polybutadiene or polyisoprene resins. An ethylene propylene rubber as used herein is a copolymer, terpolymer, or other polymer comprising primarily ethylene and propylene. Ethylene propylene rubbers may be further classified as EPM copolymers (i.e., copolymers of ethylene and propylene monomers), or EPDM terpolymers (i.e., terpolymers of ethylene, propylene, and diene monomers). Ethylene propylene diene terpolymer rubbers, in particular, have saturated main chains, with unsaturation available off the main chain for facile cross-linking. Liquid ethylene propylene diene terpolymer rubbers in which the diene is dicyclopentadiene are preferred. Suitable ethylene propylene rubbers include an ethylene propylene rubber having a GPC equivalent molecular weight (MW) of about 40,000, available from Uniroyal under the trade name Trilene CP80; a liquid ethylene propylene dicyclopentadiene terpolymer rubber having a molecular weight of about 30,000, available from Uniroyal under the trade name Trilene 54; and Trilene 67, a liquid ethylene propylene ethylidene norbomene terpolymer, having a molecular weight of about 40,000, available from Uniroyal.

Typically, the preferred molecular weights of the ethylene propylene rubbers are less than 50,000 polystyrene equivalent weight average molecular weight as measured by gel permeation chromatography (GPC). The ethylene propylene rubber is preferably present in an amount effective to maintain the stability of the properties of the substrate material over time, in particular the dielectric strength and mechanical properties. Typically, such amounts are up to about 20 wt % with respect to the total resin system, preferably about 4 wt % to about 20 wt % preferred, and with an amount of about 6 to about 12 wt % most preferred.

The optional, unsaturated polybutadiene- or polyisoprene-containing polymer component is preferably a solid, thermoplastic elastomer comprising a linear or graft-type block copolymer having a polybutadiene or polyisoprene block, and a thermoplastic block that preferably is styrene or α-methyl styrene. Possible block copolymers, e.g., styrene-butadiene-styrene tri-block copolymers, include Vector 8508M (commercially available from Dexco Polymers, Houston, Tex.), Sol-T-6302 (commercially available from Enichem Elastomers America, Houston, Tex.), and Finaprene 401 (commercially available from Fina Oil and Chemical Company, Dallas, Tex.). Preferably, the copolymer is a styrene-butadiene di-block copolymer, such as Kraton D1118X (commercially available from Shell Chemical Corporation. Kraton D1118X is a di-block styrene-butadiene copolymer, containing 30 vol % styrene.

The optional unsaturated polybutadiene- or polyisoprene-containing polymer component may further comprise a second block copolymer similar to that described above, except that the polybutadiene or polyisoprene block is hydrogenated, thereby forming a polyethylene block (in the case of polybutadiene) or an ethylene-propylene copolymer (in the case of polyisoprene). When used in conjunction with the above-described copolymer, at materials with greater "toughness" can be produced. Where it is desired to use this second block copolymer, a preferred material is Kraton GX1855 (commercially available from Shell Chemical Corp.) which is believed to be a mixture of styrene-high 1,2 butadiene-styrene block copolymer and styrene-(ethylene-propylene)-styrene block copolymer.

Thus, in a preferred embodiment, the optional unsaturated polybutadiene- or polyisoprene-containing polymer component comprises a solid thermoplastic elastomer block copolymer having the formula

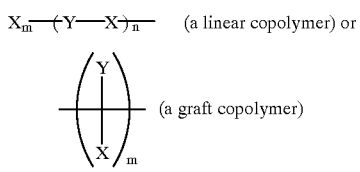

where Y is a polybutadiene or polyisoprene block, X is a thermoplastic block, and m and n represent the average block numbers in the copolymer, m being 0 or 1 and n being at least 1. The composition may further include a second thermoplastic elastomer block copolymer having the formula

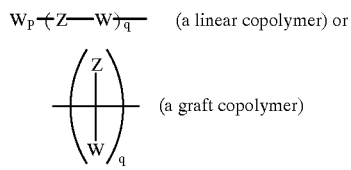

where Z is a polyethylene or ethylene-propylene copolymer block, W is a thermoplastic block, and p and q represent the average block numbers in the copolymer, p being 0 and 1 and q being at least 1. Particularly preferred compositions are those in which the thermosetting resin is polybutadiene, the ethylene propylene rubber is a liquid, and the unsaturated polybutadiene- or polyisoprene-containing polymer is a diblock polymer wherein the first block is polystyrene and the second block is polybutadiene.

The volume:volume ratio of the polybutadiene or polyisoprene resin to the optional polybutadiene- or polyisoprene-containing polymer preferably is between 1:9 and 9:1, inclusive. Typically, the amount of polybutadiene- or polyisoprene-containing polymer is about 10 to about 50 wt % of the total resin system, with an amount of about 15 to about 30 wt % preferred. The amount of combined polybutadiene or polyisoprene resin, ethylene propylene rubber, and optional, unsaturated butadiene or isoprene-containing component is in the range of from about 10 to about 75 vol % of the total electrical substrate material, with about 10 vol % to about 50 vol % preferred.

Other free radical curable monomers and polymers which can co-cure with butadiene polymers may be added for specific property or processing modifications. Such possible modification purposes include toughness, adherability to copper foil and copper plating, and prepreg handling characteristics. These co-curable polymers include random and block copolymers of primarily 1,3-addition butadiene or isoprene with styrene, α-methyl styrene, acrylate or methacrylate, or acrylonitrile monomers; homopolymers or copolymers of ethylene, such as polyethylene, ethylene oxide copolymers; natural rubber; norbomene polymers such as polydicyclopentadiene; hydrogenated styrene-isoprene-styrene copolymers and butadiene-acrylonitrile copolymers; and others. Levels of these copolymers should be less than 50 vol % of the total polymeric component.

Particulate Filler

As will be discussed hereinafter, the material described herein is preferably used as a dielectric substrate in a circuit laminate having one or more layers of conductive metal, e.g. copper, laminated thereto. Preferably, the filler material and quantity thereof is selected so as to provide the substrate with a coefficient of thermal expansion which is equal or substantially equal to the coefficient of thermal expansion of the metal layer.

Examples of preferred fillers include titanium dioxide (rutile and anatase), barium titanate, strontium titanate, silica (particles and hollow spheres) including fused amorphous silica, corundum, wollastonite, aramide fibers (e.g., Kevlar), fiberglass, $Ba_2Ti_9O_{20}$, glass spheres, quartz, boron nitride, aluminum nitride, silicon carbide, beryllia, alumina or magnesia, used alone or in combination. Particularly preferred fillers are rutile titanium dioxide and amorphous silica because these fillers have a high and low dielectric constant, respectively, thereby permitting a broad range of dielectric constants combined with a low dissipation factor achievable in the final cured product by adjusting the respective amounts of the two fillers in the composition. To improve adhesion between the fillers and resin, coupling agents, e.g., silanes, are preferably used.

The volume percent of the filler (based upon the combined volume of the resin system, fabric, and particulate filler) can be up to about 65%, with 0 to about 60% preferred, and about 30% to about 50% especially preferred. It is preferred that the particulate filler is present in an amount which is (1) greater than the amount (in volume percent) of thermosetting composition (preferably the ratio of filler to thermosetting composition is 55:45) and (2) greater than the amount (in volume percent) of the fabric.

Flame Retardant Additive

The present invention includes a flame retardant such as a bromine containing flame retardant in an amount of about 20 PHR (parts per hundred parts of resin) to about 60 PHR, and preferably contains about 30 to about 45 PHR. Examples of suitable brominated flame retardants include Saytex BT93W (ethylene bistetrabromophthalimide), Saytex 120 (tetradecabromodiphenoxy benzene), or Saytex 102 (decabromodiphenyl oxide).

Curing Agent

A curing agent is added to the composition to accelerate the curing reaction. When the composition is heated, the curing agent decomposes to form free radicals, which then initiate crosslinking of the polymeric chains. Preferred curing agents are free radical cure initiators such as organic peroxides, e.g. dicumyl peroxide, t-butylperbenzoate, di(2-t-butylperoxyisopropyl) benzene, and t-butylperoxy hexyne-3, all of which are commercially available. The peroxide curing agent is provided in an amount of between 1.5 and 6 PHR.

Fabric

The fabric comprises woven or non-woven, thermally stable webs or mats of a suitable fiber, preferably glass (E, S, and D glass) or high temperature polyester fibers (e.g., KODEL from Eastman Kodak). The fabric is present in an amount of up to about 50 vol %, with about 10 to 40 vol % preferred, and about 15 to about 25 vol % especially preferred (with respect to the entire laminate). Such thermally stable fabric provides the laminate a means of controlling shrinkage upon cure within the plane of the laminate. In addition, the use of the fabric produces a dielectric substrate with a relatively high mechanical strength.

Examples of the preferred fabrics are set forth in Tables 1 and 2. Woven fiberglass fabrics, are set forth in Table 1, and nonwoven fabric are set forth in Table 2.

TABLE 1

| Manufacturer | Style | Thickness (inches) |
|---|---|---|
| Fiber Glast | 519-A | 0.0015 |
| Clark-Schwebel | 112 | 0.0032 |
| Clark-Schwebel | 1080 | 0.0025 |
| Burlington | 106 | 0.0015 |
| Burlington | 7628 | 0.0068 |
| Clark-Schwebel | 1675 | 0.0040 |

TABLE 2

| Manufacturer | Name | Material | Style | Thickness (in.) |
|---|---|---|---|---|
| Kuraray | Vectrus ® | Thermotropic liquid crystal polymer | HC-50 | 0.002 (0.05 mm) |
| Dupont | Thermount ® | Aramid fiber | E-210 | 0.002 (0.05 mm) |
| Vilene | Cumulass | E-Glass | EPM-4050 | 0.009 (0.24 mm) |
| Freudenberg | Surfacing Veils | E-Glass | T1775 | 0.012 (0.30 mm) |

The method for preparing the laminate is as generally described in U.S. Pat. No. 5,571,609. Accordingly, the polymeric ingredients, peroxide, filler, silane, flame retardant and solvent (if use) are well dissolved or dispersed into a uniform slurry. In the next step, the glass web is saturated with slurry to the correct thickness, and then solvent is removed to form the prepreg. Then, a stack up is made of one or more layers of prepreg with outside layers of conductive foil. This stack up is densified and cured via lamination or a combination of lamination and oven baking.

The stack up is cured in a conventional peroxide cure step, typically between 330° F. (about 165° C.) and 475° F. (about 245° C.). Unlike U.S. application Ser. No. 09/132,869, there is no high temperature cure step where temperature is greater than about 250° C.

Figure 2:
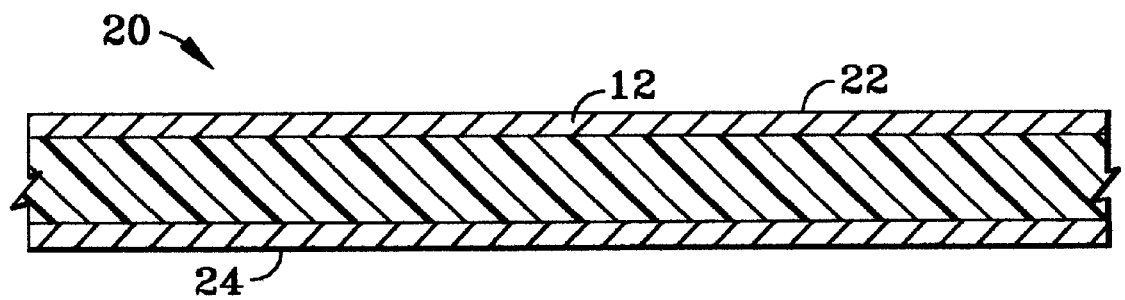
FIG. 2 is a cross-sectional elevation view of a circuit substrate material in accordance with the present invention.

Referring now to FIGS. 1 and 2, wherein like elements are number alike, preferred embodiments of the present invention are shown. FIG. 1 illustrates a single clad dielectric material 10 having a thermosetting composition in accordance with the present invention 12 and a single layer of copper 14 adhered by means known in the art to the composite 12. Such adhesion is by lamination, use of an adhesive, and the like.

FIG. 2 illustrates a diclad electrical material 20, wherein the thermosetting composition in accordance with the present invention 12 is adhered to two layers of a metal, e.g., copper 22, 24.

The invention is further illustrated by the following non-limiting examples

EXAMPLES

The following examples employed the components shown in Table 3:

TABLE 3

| Trade Name | Source | Material |
|---|---|---|
| B3000 | Nippon Soda Ltd. | 1,2-polybutadiene liquid resin |
| Vector 8508D | Dexon | tri-block (styrene-butadiene-styrene copolymer (30 wt % styrene) |
| CE 44I | CE Minerals | 10 micron amorphous silica |
| A174 | OSI Specialties | methacrylate silane |
| KX410CS | Shell | 67/33 mixture of diblock and triblock styrene-butadiene-copolymer (17 wt % styrene) |
| D1118x | Shell | diblock styrene-butadiene-copolymer (30 wt % styrene) |
| Trilene 54 | Uniroyal | ethylene propylene dicyclopentadiene liquid rubber (GPC = 30,000) |
| BT-93WFG | Albemarle Corp. | ethylene bis tetrabromophthalimide (flame retardant) |
| Luperox 500R | Elf Atochem | dicumyl peroxide |
| Vulcup R | Hercules | di(2-tert-butylperoxyisopropyl) benzene (peroxide) |
| Naugard XL-1 | Uniroyal | 2,2-oxalyldiamido bis[ethyl 3-(3,5-di-t-butyl-4-hydroxyphenyl) proprionate] (antioxidant) |
| 1080 | BFG Industries | Glass fiber mat |

The etched laminate was measured for dielectric strength and tensile strength, both unaged and after aging various aging times. Samples were aged in air circulating ovens at the designated temperatures within ±3° C., at aging temperatures indicated below. After removal from an oven, samples were conditioned at room temperature (i.e. about 25° C.) and 50% relative humidity for at least 16 hours before testing.

As described by the UL Thermal Index method in UL 746B ("Polymeric Materials—Long Term Property Evaluations"), the point of failure is the time for the measured property to decrease to 50% of its unaged value. The dielectric strength was measured using American Society for Testing Materials procedure ASTM D149. Tensile strength was measured using ASTM D638.

The dried prepregs were made so as to provide a laminated layer about 3.35 mils thick, according the formulations set forth in Table 4 (all amounts are listed in weight percent).

Examples 1 to 6 were prepared on a laboratory scale using two layers of prepreg and 1-ounce ED copper foil. The following temperature cycle was used for lamination: ramp-up at 4° F./minute from room temperature to 375° F.; dwell 2 hours at 375° F.; cool-down at 3° F./min to about 100° F. Examples 1 and 2 were made using a lamination pressure of 300 psi; Examples 3 to 6 at 1,000 psi.

Examples 7 to 9 were formed into prepregs and laminated at full production scale. Laminating pressure was 1,000 psi using a lamination temperature cycle of 6° F./minute ramp-up to 475° F., 90 minute dwell at 475° F., and 6° F./minute ramp down. Laminates were made with 6 prepreg layers, or about 0.020 inches.

TABLE 4

| Trade name | Material | Example No. | | | | | | | | |
|---|---|---|---|---|---|---|---|---|---|---|
| | | 1 | 2 | 3 | 4 | 5 | 6 | 7 | 8 | 9 |
| B 3000 | PBD | 18.13 | 15.73 | 16.93 | 16.93 | 15.73 | 15.68 | 18.13 | 15.68 | 15.68 |
| Vector 8508D | SBS | 4.53 | 4.53 | — | — | — | — | 4.53 | — | — |
| KX410CS | SB | — | — | 4.53 | — | 4.53 | 4.53 | — | 4.53 | — |
| D1118X | SB | — | — | — | 4.53 | — | — | — | — | 4.53 |
| Trilene 54 | EPDM | — | 2.4 | 1.2 | 1.2 | 2.4 | 2.4 | — | 2.4 | 2.4 |
| CE 544I | Silica | 65.96 | 65.96 | 65.96 | 65.96 | 65.96 | 65.96 | 65.96 | 65.96 | 65.96 |
| BT-93WFG | Flame Retardant | 10.03 | 10.03 | 10.03 | 10.03 | 10.03 | 10.03 | 10.03 | 10.03 | 10.03 |
| Luperox 500R | Peroxide | 0.75 | 0.75 | 0.75 | 0.75 | 0.75 | 0.75 | 0.75 | 0.75 | 0.75 |
| A174 | Silane | 0.61 | 0.61 | 0.61 | 0.61 | 0.61 | 0.61 | 0.61 | 0.61 | 0.61 |
| Naugard XL1 | Antioxidant | — | — | — | — | — | 0.05 | — | 0.05 | 0.05 |
| TOTAL | | 100.0 | 100.0 | 100.0 | 100.0 | 100.0 | 100.0 | 100.0 | 100.0 | 100.0 |

EXAMPLE 1 (COMPARATIVE)

This example is included for comparison purposes. It contains no ethylene propylene rubber, and a triblock SBS elastomeric component. Unaged dielectric strength and tensile strength data are shown in Tables 5 and 6 along with the time to 50% of the initial property value on aging at 170° C., 190° C. and 210° C. The data shown is the average from two separate preparations of this formulation.

EXAMPLE 2

In Example 2, a portion of the polybutadiene resin, B-3000, was replaced by an equal portion of Trilene 54 liquid EPDM rubber, at a level of 2.4 wt % of the total coating composition (resin system, particulate filler, and cure agent). Testing at 170° C. (Tables 5 and 6) showed an increase of about 79% in aging time to failure in dielectric strength, and of about 57% in tensile strength compared to Example 1. (Examples 1 and 2, which were laminated at 300 psi, were lower in initial tensile strength and dielectric constant than the following examples laminated at 1,000 psi.)

EXAMPLES 3 and 4

In Examples 3 and 4, Trilene 54 at the level of 1.2 wt % based upon the total coating formulation was used in place of an equal amount of B-3000 resin. A change was furthermore made in the type of polybutadiene block copolymer from Vector 8508D to Kraton KX 410CS in Example 3, or Kraton D1118X in Example 4. The Vector 8508D is a triblock SBS polymer, while Kraton KX 410CS is essentially a diblock (about 67% diblock, 33% trilblock), and Kraton D1118X is all diblock copolymer.

Example 3 aging results at 170° C., 190° C. and 210° C. were compared to those of Example 1 (Tables 5 and 6). At all three temperatures there was significant improvement in aging time in Example 3. The improvement appeared greater in tensile strength than dielectric strength, and greater at the higher two temperatures.

In Example 4, the comparison was made at 190° C. and 210° C., and again there was a substantial improvement over Example 1.

EXAMPLE 5

In Example 5, Trilene 54 was added in an amount of 2.4 wt % in lieu of an equal amount of B-3000 resin, as in Example 2. In Example 5 however, there was also replacement of the triblock SBS polymer, Vector 8508D, by a predominantly diblock SB polymer, Kraton KX 410CS. The aging results (Tables 5 and 6) were much improved for Example 5 over Example 1. Results for Example 5 were also improved over Example 3, which is similar, except it contains half as much Trilene 54. The magnitude of the improvement over Example 1, as shown in Table 4, is a 3-fold or greater increase in time to failure in the data at 190° C. and 210° C. At 170° C., the rate of degradation was so slow that testing was discontinued before failure, after 49 days in the case of dielectric strength and 88 days for tensile strength.

EXAMPLE 6

Example 6 is similar to Example 5 except a small amount of an antioxidant, Naugard XL-1, was added. Example 6 was tested at 210C, and no improvement was found over Example 5 (Table 5). This Example is included in connection with scaled-up Examples 8 and 9, which contain the same amount of antioxidant added to improve viscosity stability in processing operations. The improvements in dielectric strength and tensile strength shown in Examples 8 and 9 are therefore not associated with the antioxidant which they contain and which is absent in the Example 7.

EXAMPLE 7 (COMPARATIVE)

Comparative Example 7 was prepared in large production equipment using the same formulation as used in Example 1. It is used to compare with Examples 8 and 9 which were similarly prepared. Test samples were made nominally 0.020 inches thick in production. Comparisons were made at similar thickness, because time to aging failure is greater in thicker samples. Four test temperatures were used in this comparison: 170° C., 190° C., 210° C. and 230° C.

TABLE 5

DIELECTRIC STRENGTH AGING, 0.007-Inch THICK SAMPLES
Time at Temperature to 50% of Unaged
Dielectric Strength Value (Days)

| Temperature | Examples | | | | | |
|---|---|---|---|---|---|---|
| | 1 | 2 | 3 | 4 | 5 | 6 |
| 170° C. | 28 | 50 | 39 | NT | >49* | NT |
| 190° C. | 11 | NT | 16 | 17 | 31 | NT |
| 210° C. | 5 | NT | 10 | 8 | 26 | 27 |

TABLE 5-continued

DIELECTRIC STRENGTH AGING, 0.007-Inch THICK SAMPLES
Time at Temperature to 50% of Unaged
Dielectric Strength Value (Days)

| | Examples | | | | | |
|---|---|---|---|---|---|---|
| Temperature | 1 | 2 | 3 | 4 | 5 | 6 |
| [Unaged value (volts/mil)] | [996] | [964] | [1394] | [1273] | [1383] | [1189] |

*Test discontinued without reaching a failure point.
NT = Not tested under this condition

TABLE 6

TENSILE STRENGTH AGING, 0.007" THICK SAMPLES
Time at Temperature to 50% of Unaged
Tensile Strength Value (Days)

| | Examples | | | | | |
|---|---|---|---|---|---|---|
| Temperature | 1 | 2 | 3 | 4 | 5 | 6 |
| 170° C. | 30 | 47 | 68 | NT | >88* | NT |
| 190° C. | 12 | NT | 38 | 24 | 37 | NT |
| 210° C. | 6 | NT | 16 | 12 | 35 | 23 |
| [Unaged value (psi)] | [9022] | [8586] | [10514] | [10820] | [10226] | [11323.4] |

*Test discontinued without reaching a failure point.
NT = Not tested under this condition

EXAMPLES 8 AND 9

In Examples 8 and 9, the formulation of comparative Example 7 was changed by adding 2.4 wt % Trilene 54 in lieu of B-3000 resin; and replacing Vector 8508D by Kraton 410CS in Example 8, and Kraton D1118X in Example 9.

Aging results are shown in Tables 7 and 8 for retention of dielectric strength and tensile strength at elevated temperatures. In Examples 8 and 9, no failures occurred over the aging times observed. Even though these tests were discontinued without failure, they endured times that were many multiples of the failure times of Example 7.

Figure 3:
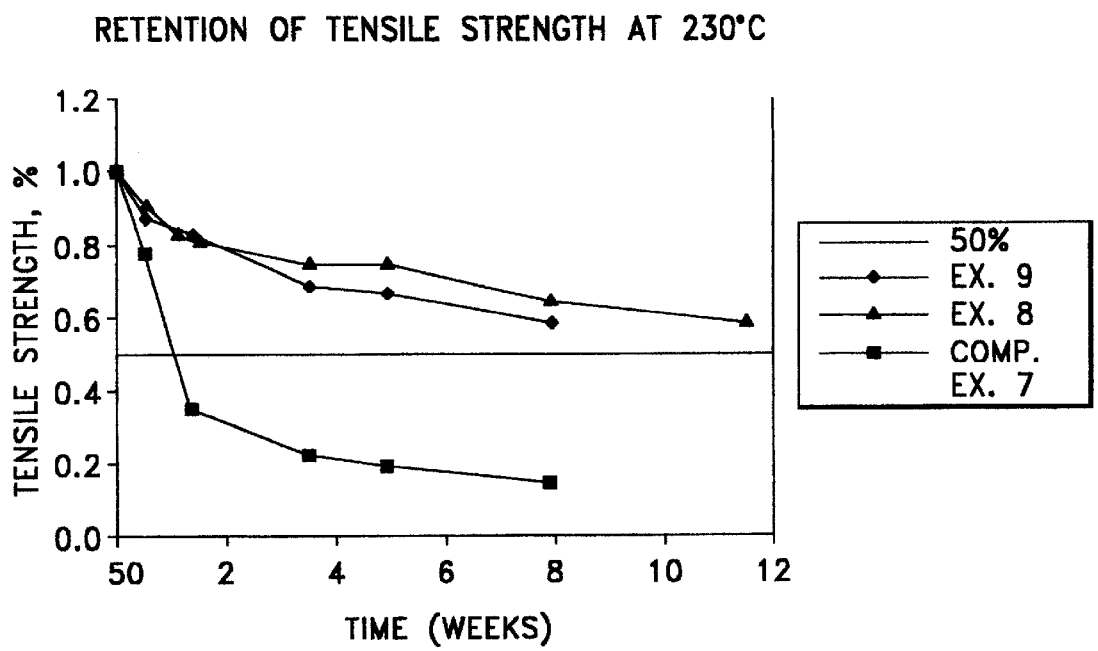
FIG. 3 is a graph showing the percent retention of tensile strength over time for two embodiments of the present invention, and a comparative example.
Figure 4:
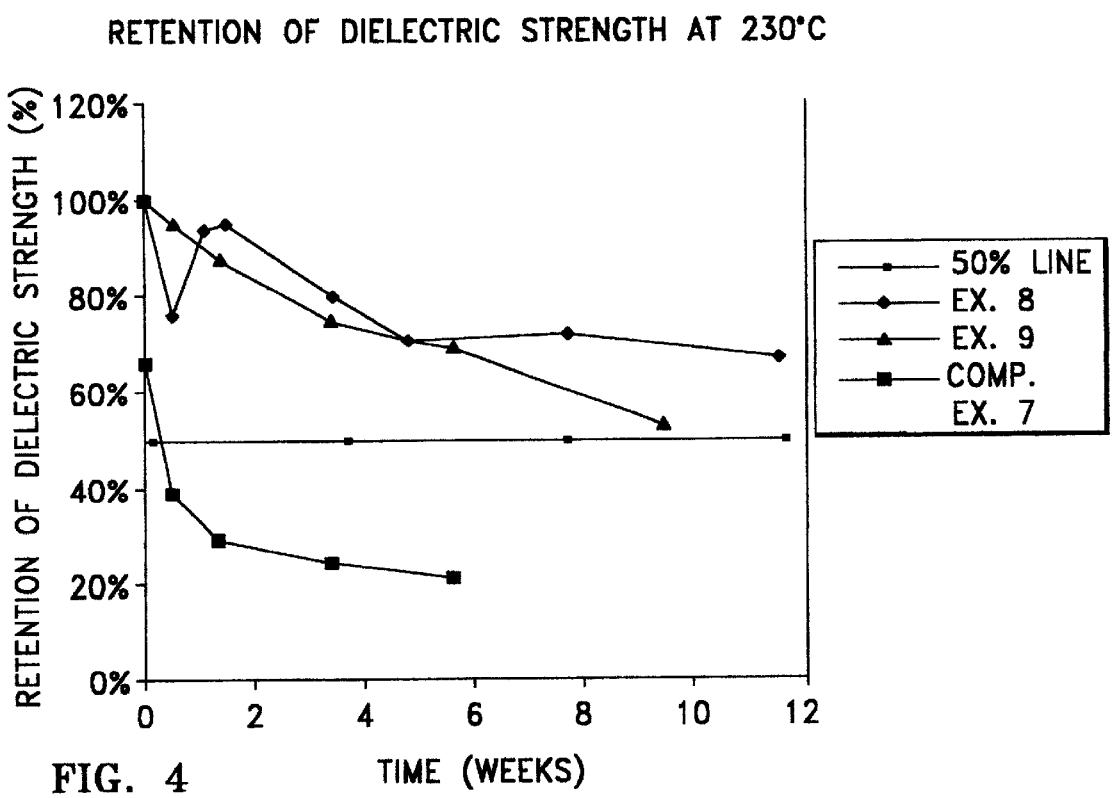
FIG. 4 is a graph showing the percent retention of dielectric strength and over time for two embodiments of the present invention, and a comparative example.

The magnitude of the improvements are indicated graphically in FIGS. 3 and 4, showing dielectric strength and tensile strength with aging at 230° C.

TABLE 7

DIELECTRIC STRENGTH AGING, 0.020" THICK SAMPLES
Time at Temperature to 50% of Unaged Dielectric Strength Value (Days)

| | Examples | | |
|---|---|---|---|
| Temperature | 7 | 8 | 9 |
| 170° C. | 63 | >154* | >126 |
| 190° C. | 42 | >70* | >98* |
| 210° C. | 15 | >91* | >105* |
| 230° C. | 7 | >35* | >70* |
| [Unaged value (volts/mil)] | [860] | [1067] | [1062] |

TABLE 8

TENSILE STRENGTH AGING, 0.020" THICK SAMPLES
Time at Temperature to 50% of Unaged Dielectric Strength Value (Days)

| | Examples | | |
|---|---|---|---|
| Temperature | 7 | 8 | 9 |
| 170° C. | 70 | >161* | >126* |
| 190° C. | 33 | >133* | >133* |
| 210° C. | 13 | >91* | >105* |
| 230° C. | 8 | >35* | >56* |
| [Unaged value (psi)] | [13368] | [13867] | [14880] |

*Test discontinued without reaching a failure point.

FIGS. 3 and 4 further demonstrate that the addition of an ethylene propylene rubber improves the retention of circuit board properties. In accordance with the UL RTI test, the failure point of the substrate material is defined as the time it takes to reach 50% of the initial property value at a given thickness and temperature. As shown in each of these Figures, each embodiment readily outperforms circuit boards without an ethylene propylene rubber.

Through inclusion of an ethylene propylene rubber in the thermosetting matrix, and substitution of a triblock copolymer with a diblock copolymer, retention of the dielectric strength and mechanical properties of the resulting electrical substrate material substantially improves, while other electrical, chemical, and mechanical properties of the material are not adversely effected. Additionally, the foregoing component ratios leads to a prepreg which has very little tackiness and can therefore be easily handled by operators. This low tackiness feature allows for the use of conventional automated layup processing, including foil cladding, using one or more known roll laminators. While the prepreg of this invention is tack-free enough to be tacked by itself using a roll laminator (e.g., nip roller) at room temperature.

While preferred embodiments have been shown and described, various modifications and substitutions may be made thereto without departing from the spirit and scope of the invention. Accordingly, it is understood that the present invention has been described by way of illustrations and not limitation.

What is claimed is:
1. An electrical circuit material, comprising:
   a substrate, which comprises
      based on the total substrate, about 10 vol % to about 75 vol % of a resin composition, the resin composition comprising a polybutadiene or polyisoprene resin, and based on the total resin composition, up to about 20 wt % of an ethylene propylene rubber having a weight average molecular weight of less than about 50,000 measured by gel permeation chromatography;
      between about 20 and about 60 PHR flame retardant;
      based on the total substrate, up to about 50 vol % fabric;
      based on the total substrate, up to about 65 vol % particulate filler; and
      an effective quantity of a peroxide curing agent; and
   a layer of conductive metal laminated to at least a portion of the substrate.
2. The electrical circuit of claim 1, wherein the circuit substrate material comprises, based on the total resin composition, from about 6 wt % to about 12 wt % ethylene propylene rubber.
3. The electrical circuit of claim 1, wherein the circuit substrate material comprises, based on the total substrate, about 10 vol % to about 50 vol % of the resin composition, and based on the total resin composition from about 4 wt % to about 20 wt % ethylene propylene rubber.

4. The electrical circuit of claim 1, wherein the circuit substrate material comprises, based on the total substrate, about 10 vol % to about 50 vol % of the resin composition, and based on the total resin composition from about 6 wt % to about 12 wt % ethylene propylene rubber.

5. The electrical circuit of claim 1, wherein the ethylene propylene containing rubber is an ethylene propylene copolymer, an ethylene propylene diene terpolymer, or a combination thereof.

6. The electrical circuit of claim 5, wherein the diene is dicyclopentadiene or ethylidene norbornene.

7. The electrical circuit of claim 1, wherein the resin composition further comprises an unsaturated butadiene- or isoprene-containing polymer capable of participating in cross-linking with the polybutadiene or polyisoprene resin, and further wherein the volume to volume ratio of the polybutadiene or polyisoprene resin to the unsaturated butadiene- or isoprene-containing polymer is between 1:9 and 9:1, inclusive.

8. The electrical circuit of claim 7, wherein the unsaturated butadiene- or isoprene-containing polymer is a copolymer of isoprene or butadiene and a second monomer.

9. The electrical circuit of claim 8, wherein the unsaturated butadiene- or isoprene-containing polymer is a di-block copolymer.

10. The electrical circuit of claim 9, wherein the unsaturated butadiene- or isoprene-containing polymer is a styrene-butadiene or α-methyl styrene-butadiene di-block copolymer.

11. The electrical circuit of claim 7, wherein the unsaturated butadiene- or isoprene-containing polymer is a thermoplastic elastomer block copolymer having one of the formula

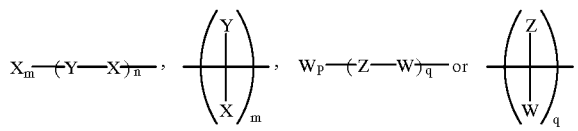

where in each formula Y is a block comprising isoprene or butadiene units, X is a thermoplastic block, and m and n represent the average block numbers in said copolymer, m being 0 or 1 and n being at least 1; and Z is a polyethylene or ethylene-propylene copolymer block, W is a thermoplastic block, and p and q represent the average block numbers in said copolymer, p being 0 or 1 and q being at least 1.

12. The electrical circuit of claim 1, further comprising up to about 60 vol % filler and up to about 40 vol % fabric.

13. The electrical circuit of claim 12, wherein the filler is titanium dioxide, barium titanate, strontium titanate, silica, fused amorphous silica, corundum, wollastonite, polytetrafluoroethylene, aramide fibers, fiberglass, $Ba_2Ti_9O_{20}$, glass spheres, quartz, boron nitride, aluminum nitride, silicon carbide, beryllia, alumina or magnesia.

14. The electrical circuit of claim 1, wherein the flame retardant is a brominated flame retardant.

15. The electrical circuit of claim 1, wherein the flame retardant is selected from the group consisting of ethylene bistetrabromophthalimide, tetradecabromodiphenoxy benzene, and decabromodiphenoxy oxide.

16. The electrical circuit of claim 1, wherein the curing agent is an organic peroxide.

17. The electrical circuit of claim 16, wherein the curing agent is selected from the group consisting of dicumyl peroxide, di(2-tert-butylperoxyisopropyl) benzene, t-butylperbenzoate, t-butylperoxy hexyne-3, and combinations thereof.

18. The electrical circuit material of claim 1, wherein the substrate further comprises about 30 volume % to about 50 volume % filler.

19. The electrical circuit material of claim 1, wherein the substrate further comprises about 15 vol % to about 25 vol % fabric.

20. The electrical circuit material of claim 1, wherein the metal is copper.

21. An electrical circuit material, comprising:
a substrate, which comprises
based on the total substrate, about 10 vol % to about 75 vol % of a resin composition, the resin composition comprising a polybutadiene or polyisoprene resin, an unsaturated butadiene- or isoprene-containing di-block copolymer, and based on the total resin composition, about 4 to about 20 wt % of an ethylene propylene rubber having a weight average molecular weight of less than about 50,000 measured by gel permeation chromatography;
between about 20 and about 60 PHR flame retardant;
based on the total substrate, up to about 50 vol % fabric;
based on the total substrate, up to about 65 vol % particulate filler; and
an effective quantity of a peroxide curing agent; and
a layer of conductive metal laminated to at least a portion of the substrate.

22. The electrical circuit of claim 21, wherein the circuit substrate material comprises, based on the total resin composition, from about 6 wt % to about 12 wt % ethylene propylene rubber.

23. The electrical circuit of claim 21, wherein the circuit substrate material comprises, based on the total substrate, about 10 vol % to about 50 vol % of the resin composition, and based on the total resin composition from about 4 wt % to about 20 wt % ethylene propylene rubber.

24. The electrical circuit of claim 21, wherein the circuit substrate material comprises, based on the total substrate, about 10 vol % to about 50 vol % of the resin composition, and based on the total resin composition from about 6 wt % to about 12 wt % ethylene propylene rubber.

25. The electrical circuit of claim 21, wherein the ethylene propylene containing rubber is an ethylene propylene copolymer, an ethylene propylene diene terpolymer, or a combination thereof.

26. The electrical circuit of claim 25, wherein the diene is dicyclopentadiene or ethylidene norbornene.

27. The electrical circuit of claim 21, wherein the unsaturated butadiene- or isoprene-containing polymer is a styrene-butadiene or α-methyl styrene-butadiene di-block copolymer.

28. The electrical circuit of claim 21, wherein the unsaturated butadiene- or isoprene-containing polymer is a thermoplastic elastomer block copolymer having one of the formula

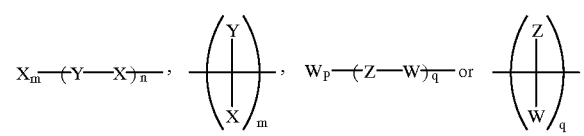

wherein each formula Y is a block comprising isoprene or butadiene units, X is a thermoplastic block, and m and n represent the average block numbers in said copolymer, m being 0 or 1 and n being at least 1; and Z is a polyethylene or ethylene-propylene copolymer block, W is a thermoplastic block, and p and q represent the average block numbers in said copolymer, p being 0 or 1 and q being at least 1.

29. The electrical circuit of claim 21, further comprising up to about 60 vol % filler and up to about 40 vol % fabric.

30. The electrical circuit of claim 21, wherein the filler is titanium dioxide, barium titanate, strontium titanate, silica, fused amorphous silica, corundum, wollastonite, polytetrafluoroethylene, aramide fibers, fiberglass, $Ba_2Ti_9O_{20}$, glass spheres, quartz, boron nitride, aluminum nitride, silicon carbide, beryllia, alumina or magnesia.

31. The electrical circuit of claim 21, wherein the flame retardant is selected from the group consisting of a brominated flame retardant ethylene bistetrabromophthalimide, tetradecabromodiphenoxy benzene, decabromodiphenoxy oxide, and combinations thereof.

32. The electrical circuit of claim 21, wherein the curing agent is an organic peroxide selected from the group consisting of dicumyl peroxide, di(2-tert-butylperoxyisopropyl) benzene, t-butylperbenzoate, t-butylperoxy hexyne-3, and combinations thereof.

33. The electrical circuit material of claim 21, wherein the substrate further comprises about 30 volume % to about 50 volume % filler.

34. The electrical circuit material of claim 21, wherein the substrate further comprises about 15 vol % to about 25 vol % fabric.

35. The electrical circuit material of claim 21, wherein the electrical circuit substrate material has a dielectric strength of equal to or greater than 500 V/mil.

* * * * *

UNITED STATES PATENT AND TRADEMARK OFFICE
CERTIFICATE OF CORRECTION

PATENT NO. : 6,291,374 B1
DATED : September 18, 2001
INVENTOR(S) : Vincent R. Landi It is certified that error appears in the above-identified patent and that said Letters Patent is hereby corrected as shown below:

Column 3,
Line 31, after "present" delete "invention." and insert therefor -- invention; --
Line 34, after "comparative" delete "example." and insert therefor -- example; and --
Line 36, after "strength" delete "and"

Column 5,
Line 8, after "copolymer" delete "at"

Column 7,
Line 39, after "(if" delete "use" and insert therefor -- used --
Line 55, before "alike" delete "number" and insert therefor -- numbered --

Column 8,
Line 50, after "according" insert -- to --

Column 12,
Line 31, after "ratios" delete "leads" and insert therefor -- lead --
Line 42, after "of" delete "illustrations" and insert therefor -- illustration --

Signed and Sealed this

Twenty-fourth Day of May, 2005

JON W. DUDAS
*Director of the United States Patent and Trademark Office*